(12) United States Patent
Luo et al.

(10) Patent No.: US 11,520,491 B2
(45) Date of Patent: Dec. 6, 2022

(54) PARITY PROTECTION IN NON-VOLATILE MEMORY

(71) Applicant: Micron Technology, Inc., Boise, ID (US)

(72) Inventors: Xiangang Luo, Fremont, CA (US); Zhengang Chen, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 17/228,086

(22) Filed: Apr. 12, 2021

(65) Prior Publication Data
US 2022/0326858 A1    Oct. 13, 2022

(51) Int. Cl.
*G06F 3/06* (2006.01)

(52) U.S. Cl.
CPC .......... *G06F 3/0619* (2013.01); *G06F 3/0653* (2013.01); *G06F 3/0679* (2013.01)

(58) Field of Classification Search
CPC ..... G06F 3/0619; G06F 3/0653; G06F 3/0679
See application file for complete search history.

(56) References Cited

U.S. PATENT DOCUMENTS

| 2014/0231954 A1 | 8/2014 | Lue | |
|---|---|---|---|
| 2016/0026525 A1* | 1/2016 | Barndt | G06F 11/1068 |
| | | | 714/773 |
| 2016/0179386 A1 | 6/2016 | Zhang | |
| 2019/0384671 A1* | 12/2019 | Chen | G11C 29/52 |
| 2021/0089392 A1* | 3/2021 | Shirakawa | G06F 11/1012 |
| 2021/0089451 A1* | 3/2021 | Hao | G06F 12/0895 |
| 2021/0286551 A1* | 9/2021 | Dongaonkar | G06F 12/0238 |

FOREIGN PATENT DOCUMENTS

WO    2017074570 A1    5/2017

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

* cited by examiner

*Primary Examiner* — Hiep T Nguyen
(74) *Attorney, Agent, or Firm* — Brooks, Cameron & Huebsch, PLLC

(57) ABSTRACT

A method that includes writing a plurality of codewords to a plurality of memory blocks of a memory device, where each of the plurality of codewords has a physical codeword index corresponding to a respective memory block in which each codeword is written, and assigning a virtual codeword index to each of the plurality of codewords to provide a plurality of virtual codeword indices, where assigning the virtual codeword index to each of the plurality of codewords is based, at least in part, on a location in a virtual block among a plurality of virtual blocks of memory cells corresponding to the physical codeword index of each codeword among the plurality of codewords.

17 Claims, 8 Drawing Sheets

552 ─

┌─────────────────────────────────────────────┐
│ WRITE A PLURALITY OF CODEWORDS TO A PLURALITY OF MEMORY BLOCKS │
│ OF A MEMORY DEVICE, WHERE EACH OF THE PLURALITY OF CODEWORDS ├── 554
│ HAS A PHYSICAL CODEWORD INDEX CORRESPONDING TO │
│ A RESPECTIVE MEMORY BLOCK IN WHICH EACH CODEWORD IS WRITTEN │
└─────────────────────────────────────────────┘

┌─────────────────────────────────────────────┐
│ ASSSIGN A VIRTUAL CODEWORD INDEX TO EACH OF THE PLURALITY OF │
│ CODEWORDS TO PROVIDE A PLURALITY OF VIRTUAL CODEWORD INDICES │
│ WHERE ASSIGNING THE VIRTUAL CODEWORD INDEX TO EACH OF │
│ THE PLURALITY OF CODEWORDS IS BASED, AT LEAST IN PART, ├── 556
│ ON A LOCATION IN A VIRTUAL BLOCK AMONG A PLURALITY OF │
│ VIRTUAL BLOCKS OF MEMORY CELLS CORRESPONDING TO │
│ THE PHYSICAL CODEWORD INDEX OF EACH CODEWORD │
│ AMONG THE PLURALITYH OF CODEWORDS │
└─────────────────────────────────────────────┘

552 ⇘

```
┌─────────────────────────────────────────────────────────────┐
│ WRITE A PLURALITY OF CODEWORDS TO A PLURALITY OF MEMORY BLOCKS │
│ OF A MEMORY DEVICE, WHERE EACH OF THE PLURALITY OF CODEWORDS   │──554
│          HAS A PHYSICAL CODEWORD INDEX CORRESPONDING TO        │
│   A RESPECTIVE MEMORY BLOCK IN WHICH EACH CODEWORD IS WRITTEN  │
└─────────────────────────────────────────────────────────────┘
                                │
┌─────────────────────────────────────────────────────────────┐
│   ASSSIGN A VIRTUAL CODEWORD INDEX TO EACH OF THE PLURALITY OF │
│ CODEWORDS TO PROVIDE A PLURALITY OF VIRTUAL CODEWORD INDICES   │
│    WHERE ASSIGNING THE VIRTUAL CODEWORD INDEX TO EACH OF       │
│      THE PLURALITY OF CODEWORDS IS BASED, AT LEAST IN PART,    │──556
│       ON A LOCATION IN A VIRTUAL BLOCK AMONG A PLURALITY OF    │
│      VIRTUAL BLOCKS OF MEMORY CELLS CORRESPONDING TO           │
│        THE PHYSICAL CODEWORD INDEX OF EACH CODEWORD            │
│              AMONG THE PLURALITYH OF CODEWORDS                 │
└─────────────────────────────────────────────────────────────┘
```

*FIG. 5*

PARITY PROTECTION IN NON-VOLATILE MEMORY

TECHNICAL FIELD

Embodiments of the disclosure relate generally to memory sub-systems, and more specifically, relate to parity protection in non-volatile memory.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIGS. 3-1 and 3-2 illustrate an example memory device and a codeword parity management unit in accordance with some embodiments of the present disclosure.

FIGS. 4-1 and 4-2 illustrate an example memory device and a codeword parity management unit in accordance with some embodiments of the present disclosure.

FIG. 5 is a flow diagram corresponding to a method for codeword parity protection in accordance with some embodiments of the present disclosure.

DETAILED DESCRIPTION

Figure 1:
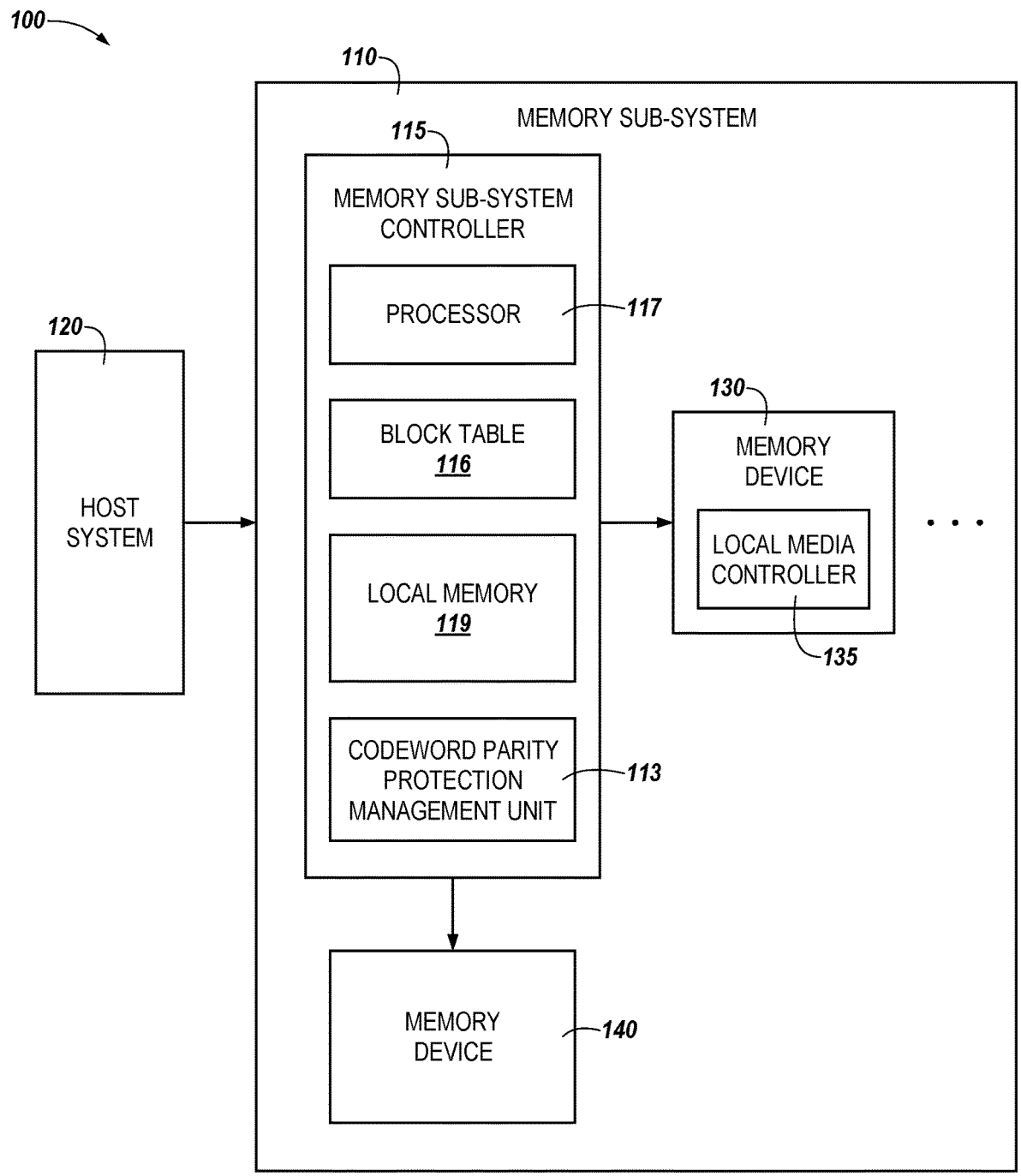
FIG. 1 illustrates an example computing system that includes a memory sub-system in accordance with some embodiments of the present disclosure.

Aspects of the present disclosure are directed to parity protection in non-volatile memory, in particular to memory sub-systems that include a codeword parity management unit as provided herein. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. A memory die can be referred to herein as a "logical unit" or a "LUN," which can be grouped to form a "LUN Stripe." A LUN Stripe can include one or more planes that are treated as a single LUN (or die) when performing read operations, write operations, and/or erase operations involving the LUN Stripe. However, in some embodiments, each plane in a LUN Stripe can perform a same operation as other planes included in the LUN Stripe. For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

A memory sub-system can employ techniques to perform data recovery in the event of a memory defect associated with the programming of user data (e.g., data written by a host system) to a memory device of the memory sub-system. Conventionally, memory defects can be managed by a controller of the memory sub-system by generating parity data (e.g., exclusive-or (XOR) parity data) based on the written host data. The generated parity data (e.g., the XOR parity data) can be written by a controller to a cache memory (e.g., a volatile memory device such as a random access memory (RAM), dynamic random access memory (DRAM), or synchronous dynamic random access memory (SDRAM)) of the controller.

In many electronic devices (e.g., mobile devices) including electronic devices having an array of memory cells storing multiple bits per cell (e.g., quad-level cells (QLCs)), both multiple page (e.g., multi-page) parity protection and multiple plane (e.g., multi-plane) parity protection (e.g., protection for a failure of a memory device) are employed. In addition, a memory sub-system can have a multi-plane memory die (e.g., N planes) including multiple blocks of memory cells arranged in multiple planes (e.g., a multi-plane memory device) for which multi-plane parity protection can be employed. Each block can be divided into multiple sub-blocks that can each include multiple pages per block.

Currently, redundant array of independent NAND (RAIN) parity protection for a memory sub-system in an SSD is an effective way of adding protection while considering the management of the NAND device. The term "RAIN," as used herein, is an umbrella term for computer information (e.g., data) storage schemes that divide and/or replicate (e.g., mirror) information among multiple pages of a memory sub-system, for instance, in order to help protect the data stored in the memory sub-system. A RAIN array may appear to a user and the operating system of a computing device as a single memory device (e.g., disk). RAIN can include striping (e.g., splitting) information so that different portions of the information are stored on different pages, planes, and/or memory dice of the memory sub-system. The portions of the memory sub-system that store the split data can be collectively referred to as a RAIN stripe. As used herein, RAIN can also include mirroring, which can include storing duplicate copies of data on more than one page of more than one memory sub-system.

A RAIN stripe can include (e.g., be a combination of) user data and parity data. The parity data of the RAIN stripe, which can be referred to herein as the parity portion of the RAIN stripe, can include error protection data that can be used to protect user data stored in the memory sub-system against defects and/or errors that may occur during operation of the memory sub-system. For example, the RAIN stripe can protect user data stored in memory sub-system against defects and/or errors that may occur during operation of the memory sub-system and can therefore provide protection against a failure of the memory sub-system.

Turning back to the NAND memory device, pages of memory in the NAND memory device are typically sized so that codewords (CW) that include user data, error data (e.g., error correction coding (ECC) check bits), and/or metadata are contained on a single physical page. This is due to potential drawbacks of making an ECC CW cross a page boundary, which can cause performance degradation in reading ECC CW from more than one page. In contrast, if the NAND memory device supports reading the two pages concurrently, ECC CW can cross a page boundary with less impact on performance. One motivation for ECC CW to cross a page boundary can be that the page size of a memory device is too small to fit an entire single CW. This typically applies to SCM (storage class memory); that the user sector size is large, such that fitting a CW within a single page can lead to weak ECC; and/or that a memory reliability requirement on ECC is stringent such that a strong ECC is needed, i.e., more ECC parity bytes are required.

An existing solution for plane protection in the RAIN parity paradigm is to XOR the CWs on a plane basis from each die in the stripe and store the RAIN parity on the last plane in the last die of a memory device. For example, consider two dice in a memory device where each die has a six-plane NAND. In this example, there is a total of twelve planes in a RAIN stripe from which one plane can include the result of an XOR operation involving the other eleven planes. However, when this solution is applied to a cross-plane CW layout, it does not provide the necessary protection against plane/block failure. This is because CWs, especially user data of CWs, can span two planes. As a result, the failure of just one plane has the potential of corrupting up to five CWs (assuming each plane can store four standard codewords) making the RAIN recovery impossible, a situation that is not acceptable.

Aspects of the present disclosure address the above and other deficiencies by providing a RAIN protection scheme for cross-plane and/or cross-block ECC codeword format on NAND. The method can be extended to other cross-plane and/or cross-block CW formats. Further, if the CWs also cross memory dice, the proposed scheme can be extended to die protect RAIN for cross-plane/die CW formats. To this end, aspects of the present disclosure use "virtual planes" that provide an indexing scheme that "overlays" the existing indexing scheme of the CWs to enable RAIN CW parity generation and RAIN recovery. Each virtual plane in this indexing scheme indexes not only CWs from a first plane (e.g., Plane 0), but also at least one full CW from a second plane (e.g., Plane 1) directly adjacent to the first plane. In this way, the present disclosure indexes "M+1" CWs in each virtual plane as compared to "M" CWs stored in each of the planes, where M is the maximum number of CWs in each plane. So, for example when there are four CWs stored in each plane, each of the virtual planes indexes five CWs. In addition, the plane protect RAIN scheme is also generated by XOR-ing CWs from each virtual plane in their respective order. So, in the present example with four CWs for any single plane failure each CW in the failed plane is at least five CWs apart from those CWs that provides RAIN protection. As a result, there is always a virtual plane having suitably indexed CWs from the adjacent planes that can provide the RAIN protection for the failed plane and RAIN recovery becomes achievable.

As for the required storage for CWs indexed in this new plane protect RAIN scheme, calculation shows that this CW indexing format takes about one and a half (1.5) pages, more specifically five CWs, as RAIN parity. So, assuming X number of planes and N number of dice and given that $4X-1$ CWs are stored per multi-plane page, the RAIN overhead for the plane protect RAIN scheme of the present disclosure is $5/(Nx(4x-1))$ or, more generally, $(M+1)/(Nx(Mx-1))$. Following the same method, if a system has a CW layout that crosses not only planes but also dice, die protect RAIN is also achievable.

As used herein, the designators "X", "N", "R", "M" and "P", particularly with respect to reference numerals in the drawings, indicates that a number of the particular feature so designated can be included. As used herein, "a number of" a particular thing can refer to one or more of such things (e.g., a number of memory devices can refer to one or more memory devices). As used herein, the terms "first," "second," "third," and "fourth" are used to differentiate between one feature from another and do not necessarily imply an order between the features so designated. For example, "a first codeword" does not necessarily imply that that the first codeword came before "a second codeword."

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DINM) interface (e.g., DINM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit (LUN) of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g, DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can further include a codeword parity protection management unit 113. The codeword parity management unit 113 generates parity data and concatenates the parity onto user data to generate one or more codewords (e.g, codewords 338-0 to 338-3 described in connection with FIGS. 3-1 and 3-2, herein) for each plane (e.g., plane 334-0 to 334-5 described in connection with FIGS. 3-1 and 3-2, herein) of a Logical Unit (LUN, also known as a memory die) of the memory device 130, 140 and generates parity data and/or user data as virtual codeword indices (e.g., virtual codeword indices 340-0 to 340-4 described in connection with FIGS. 3-1 and 3-2, herein) for each virtual plane (e.g., virtual plane 332-0 to 332-4 described in connection with FIGS. 3-1 and 3-2, herein) of the LUN. Although not shown in FIG. 1, so as to not obfuscate the drawings, the codeword parity management unit 113 can include various circuitry to facilitate writing of a plurality of codewords to a plurality of memory blocks in a memory device and assigning a virtual codeword index to each of the plurality of codewords to provide a plurality of virtual codeword indices. To facilitate assigning the virtual codeword index, each of the of the plurality of codewords has a physical codeword index corresponding to a respective memory block in which each codeword is written. The codeword parity protection management unit 113 then assigns the virtual codeword index to each of the plurality of codewords based, at least in part, on a location in a virtual block among a plurality of virtual blocks of memory cells corresponding to a physical codeword index of each codeword among the plurality of codewords.

For the various embodiments, the plurality of memory blocks of the memory device 130 comprise a plane of memory cells, where in particular circumstances as discussed herein, the plurality of codewords are not fully contained within the plane of memory cells. This can happen when the size of the plurality of codewords is too large to be fully contained with the set size of a plane of the memory device (e.g., in a cross-plane CW layout situation). As a result, a codeword is written that spans two adjacent planes of the memory die. For example, for multiple planes of a memory device (e.g., a die with a six-plane NAND) a first portion of a codeword (e.g., CW-3) of the plurality of codewords (e.g., CW-0, CW-1, . . . CW-3) may be written in a first plane (e.g., Plane 0) of the multiple planes (e.g., Plane 0, Plane 1 . . . Plane 5) and a second portion of the same codeword (e.g., CW-3) may be written in a second plane (e.g., Plane 1 adjacent to Plane 0) of the multiple planes.

In some embodiments, the codeword parity management unit 113 can be configured to error code data with a fixed codeword size to address the above described situation. Where the number of memory devices 130 and/or 140 have a fixed physical page size, the fixed physical page size may not be evenly divisible by the fixed codeword size. The codeword parity management unit 113 can be configured to write a plurality of codewords to a plurality of planes of memory such that a subset of the plurality of codewords each span at least two planes of memory. The codeword parity management unit 113 can be configured to write a non-integer number of codewords to first plane of memory (e.g., in each of a first plurality of blocks of memory) and to write a non-integer number of codewords to second plane of memory (e.g., in each of a second plurality of blocks of memory) such that the non-integer number of codewords written to a respective first plane of memory plus the non-integer number of codewords written to a respective second plane of memory comprises an integer number of codewords collectively.

In contrast to the plane of memory cells discussed above (a physical plane of memory cells), the virtual blocks of memory cells (corresponding to the physical codeword index of each codeword) are provided in a virtual plane of memory cells, where the virtual codeword indices are fully contained within the virtual plane of memory cells. In addition to being fully contained within the virtual plane of memory cells, the number of the virtual codeword indices in the virtual plane is greater than the plurality of codewords in the plane of memory cells. As discussed more fully herein, having a greater number of virtual codeword indices in each virtual plane than the number of codewords in each plane of memory cells helps to ensure that a codeword spanning two adjacent planes is accessible via the virtual plane if one of the two planes fails (e.g., CW-3 spanning both Plane 1 and Plane 2 that would be lost in the case of Plane 2 failing).

So, referring again to FIG. 1, the codeword parity management unit 113 in writing the plurality of codewords to the plurality of memory blocks of the memory device 130 and/or 140 can write M codewords in each block of the plurality of memory blocks of the memory device 130 and/or 140, where a first portion of at least one of the M codewords is written in the first block of the plurality of memory blocks and a second portion of the at least one of the M codewords is written in a second block of the plurality of memory blocks. The codeword parity management unit 113 also assigns an indicator value of 0 (zero) to M−1 for the physical codeword index corresponding to the respective memory block in which each codeword is written. As noted above, however, the number of the virtual codeword indices are greater than the plurality of codewords. So, the codeword parity management unit 113 in assigning the virtual codeword index to each of the plurality of codewords also assigns the virtual codeword index of M+1 virtual codewords (or greater, such as M+2 virtual codewords, M+3 virtual codewords, etc.) in each virtual block of the plurality of virtual blocks of the memory device, where the virtual codeword index has an indicator value of 0 to M and where each of the M+1 virtual codewords is completely contained within a virtual block of the plurality of virtual blocks. The value for M in the above embodiment is a positive non-zero integer, where in a specific embodiment M is an integer from 2 to 20. In a more specific embodiment, M is 4 as described in connection with FIGS. 3-1 and 3-2 and 4-1 and 4-2, herein.

The codeword parity management unit 113 further accumulates an exclusive or (XOR) operation for each of the plurality of codewords and virtual codewords and generates a RAIN parity codeword for each of the accumulated XOR operation of the plurality of codewords having the virtual codeword index in the memory sub-system (e.g., in the local memory 119). The codeword parity management unit 113 can further write the plurality of codewords and the RAIN parity codeword for each of the accumulated XOR operation of the plurality of codewords having the virtual codeword index to a RAIN stripe, wherein the RAIN parity codeword is concatenated after the last codeword to maintain a numeric order of the virtual codeword index, as will be discussed more fully herein.

In some embodiments, the codeword parity management unit 113 can include special purpose circuitry in the form of an ASIC, FPGA, state machine, and/or other logic circuitry that can allow the codeword parity management unit 113 to orchestrate and/or perform operations to selectively perform operations to perform codeword management operations for the memory device 130 and/or the memory device 140 as described herein.

In some embodiments, the memory sub-system controller 115 includes at least a portion of the codeword parity management unit 113. For example, the memory sub-system controller 115 can include a processor 117 (processing device) configured to execute instructions stored in local memory 119 for performing the operations described herein. In some embodiments, the codeword parity management unit 113 is part of the host system 110, an application, or an operating system.

In a non-limiting example, an apparatus (e.g., the computing system 100) can include a codeword parity management unit 113. The codeword parity management unit 113 can be resident on the memory sub-system 110. As used herein, the term "resident on" refers to something that is physically located on a particular component. For example, the codeword parity management unit 113 being "resident on" the memory sub-system 110 refers to a condition in which the hardware circuitry that comprises the codeword parity management unit 113 is physically located on the memory sub-system 110. The term "resident on" can be used interchangeably with other terms such as "deployed on" or "located on," herein.

One of the memory device 130 and/or 140 can further include a redundant array of independent NAND (RAIN) component (e.g., hardware circuitry, logic circuitry, and/or instructions executable by hardware circuitry and/or logic circuitry) configured to perform an exclusive-or (XOR) operation to generate parity information corresponding to each codeword having the same physical codeword index. For example, the RAIN component can identify an error in a block or plane of the plurality of memory blocks and perform an exclusive or (XOR) operation in a RAIN operation using the virtual codeword index to access a codeword spanning two adjacent blocks or planes that was lost when one of the two planes fails.

In some embodiments, the memory sub-system controller 115 includes a block table 116. The block table 116 can store data for blocks of memory in the number of memory devices (e.g., the memory device 130 and/or 140). Data stored in the block table 116 can include valid page data, erase count data, and other health and/or status data. The memory sub-system controller 115 can be configured to maintain the block table 116 to include an indication of whether each block of memory is a bad block of memory. For example, a number of bad blocks can be indicated in the block table 116 as a result of those blocks failing a test of blocks in the number of memory devices (e.g., memory device 130 and/or 140). Data accessed from the block table 116 can be indexed by physical block addresses. The memory sub-system controller 115 can be configured to update the health and/or status data for a particular block in the block table 116, e.g., in response to a write, an erase, or an error event for the particular block.

Figure 2:
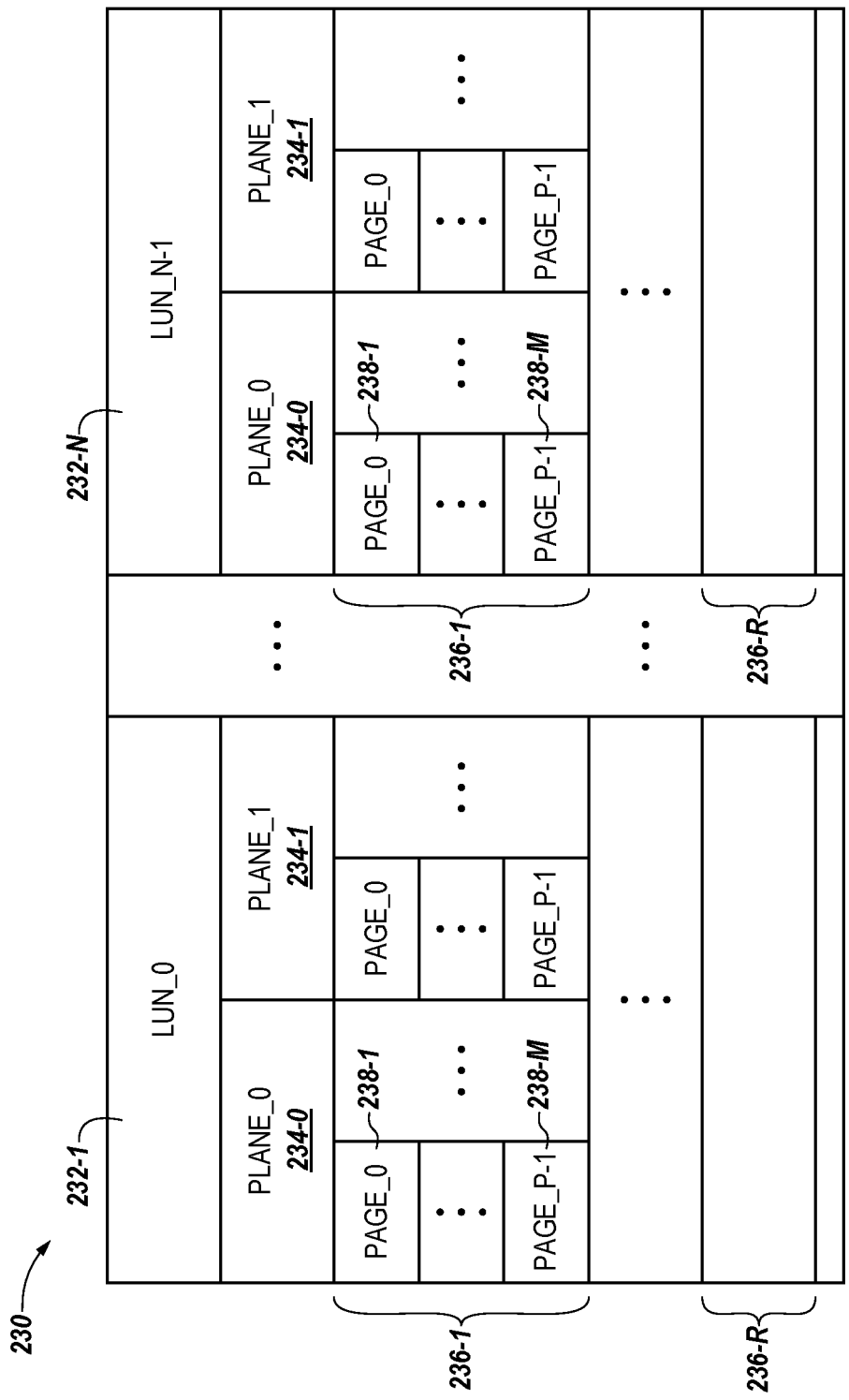
FIG. 2 illustrates an example memory device in accordance with some embodiments of the present disclosure.

FIG. 2 illustrates an example memory device 230 in accordance with some embodiments of the present disclosure. The memory device 230 can be analogous to the memory device 130 illustrated in FIG. 1, herein. Although not shown so as not obfuscate the drawings, the memory device 230 can be a non-volatile memory device 230 that includes an array of non-volatile memory cells. In some embodiments, the memory device 230 can be a NAND flash memory device (e.g., a 3-D NAND flash memory device) and/or can be deployed in a mobile computing device such as a mobile phone, laptop, IoT device, or the like.

As shown in FIG. 2, the memory device 230 can include multiple Logical Units (or dice) 232-1 to 232-N (e.g., the LUN_0 to the LUN_N−1), which each include two memory planes 234-0 and 234-1 (PLANE_0 and PLANE_1). A number of blocks 236-1 to 236-R (e.g., the BLOCK-0 to the BLOCK-R) are included in each of the planes 234-0 and 234-1. That is, as shown in FIG. 2, a number of blocks 236-1 to 238-R can be included in each of plane 234-0 and 234-1, and two planes 234-0 and 234-1 are included on each of LUN 232-1 to 232-N. A block of memory cells can be erased together in one erase operation.

As shown in FIG. 2, each of blocks 236-1 to 236-R include a number of pages of memory cells (e.g., Page_0 238-1 to Page_P−1 238-M). As described herein, a page of memory cells can be written or read together in one write or read operation. Plane 234-0 can represent half of the blocks of memory on LUN 232-0, while plane 234-1 can represent the other half. In one or more embodiments, planes can be divided between odd and even numbered blocks of memory. In one or more embodiments, an "odd" or "even" block of memory can be a logical representation of data where data units from half (the "odd" numbered) of the memory cells coupled to access lines associated with the block of memory are stored in an "odd" block of memory and data units from the other half (the "even" numbered) of the memory cells coupled to access lines associated with the block of memory are stored in an "even" block of memory. Embodiments are not limited to a particular plane of memory representing half of the blocks of memory on a given die having more than one plane of memory; other distributions of blocks of memory between planes of memory are possible. Nor are embodiments limited to memory devices with a particular number of blocks of memory, planes of memory, or LUN. According to a number of embodiments of the present disclosure, a single codeword can be written to span more than one page 238-1 to 238-P, more than one block 236-1 to 236-R, more than one plane 234-0, 234-1 and/or more than one LUN 232-1 to 232-N.

Figures 1, 3:
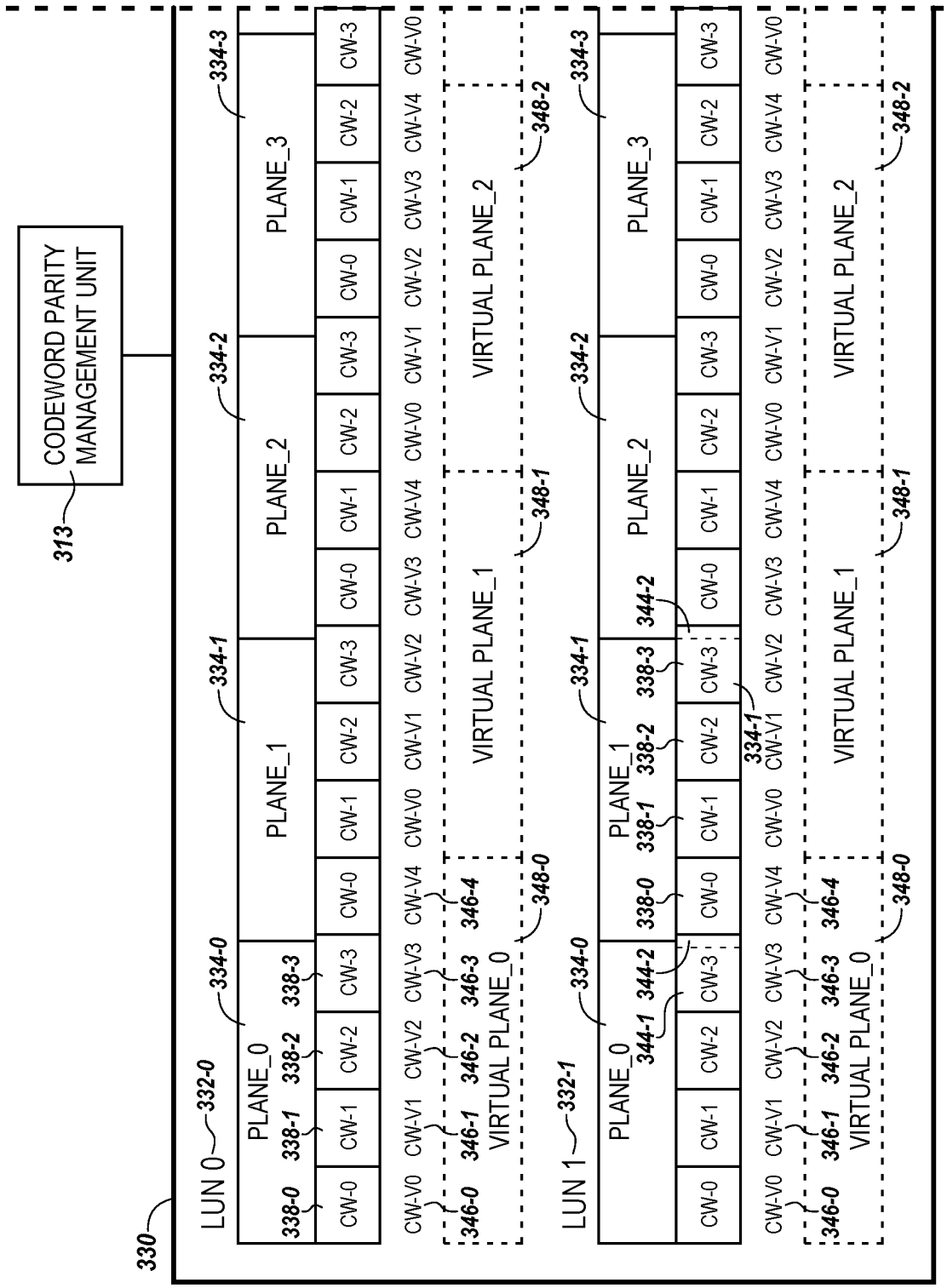
Figures 2, 3:
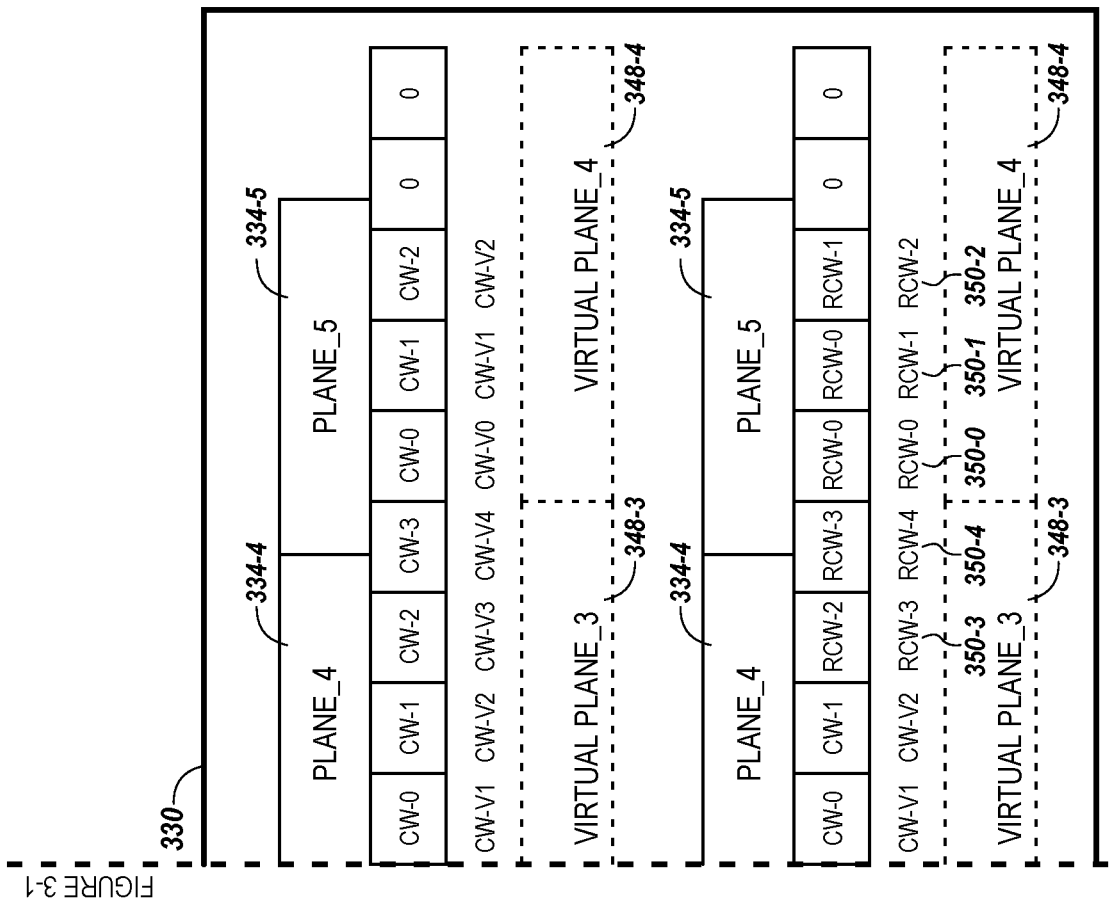

FIGS. 3-1 and 3-2 illustrates an example memory device 330 and codeword parity management unit 313 in accordance with some embodiments of the present disclosure. The codeword parity management unit 313 can be analogous to the codeword parity management unit 113 illustrated in FIG. 1 and the memory device 330 can be analogous to the memory device 130 or 140 illustrated in FIG. 1 and/or the memory device 230 illustrated in FIG. 2. In some embodiments, the memory device 330 and/or the codeword parity management unit 313 can be deployed in a mobile computing device, such as a smartphone, laptop computer, IoT device, or the like.

As shown in FIGS. 3-1 and 3-2, the memory device 330 includes logical units (LUN) LUN-0 332-0 and LUN-1 332-1. As illustrated, each logical unit LUN-0 332-0 and LUN-1 332-1 includes one or more planes that are treated as a single LUN (or die) when performing read operations, write operations, and/or erase operations involving a LUN Stripe. In the present example, each LUN-0 332-0 and LUN-1 332-1 includes multiple memory planes (PLANE-0, 334-0; PLANE-1, 334-1; PLANE-2, 334-2; PLANE-3, 334-3; PLANE-4, 334-4 and PLANE-5, 334-5), which can be analogous to the memory planes 234-0 and 234-1 illustrated in FIG. 2. Each of the planes 334-0 through 334-5 can include one or more blocks (or sub-blocks) (e.g., blocks 236-1 to 236-R illustrated in FIG. 2, herein) each having a plurality of pages (e.g., Page 238-0 to 238-P illustrated in FIG. 2, herein) that include codewords (CW-0, 338-0: CW-1, 338-1; CW-2, 338-2 and CW-3, 338-3) that are written to a number of pages in Plane-0 334-0, Plane-1 334-1, etc. in LUN 332-0 and LUN 332-1. Although not specifically labeled as such, each plane 334-0 to 334-5 can include different blocks of memory and different pages of memory.

As discussed herein, the codeword parity management unit 313 writes codewords (e.g., 338-0 to 338-3) to multiple planes (e.g., 334-0 through 334-5) of the LUN-0 332-0 and LUN-1 332-1, where a first portion 344-1 of at least one of the codeword (e.g., CW-3 338-3) is written in a first plane (e.g., 334-0, Plane-0) of the LUN (e.g., LUN-0 332-0) and a second portion 344-2 of the at least one codeword (e.g., CW-3 338-3) is written in a second plane (e.g., 334-1, Plane-0) of the LUN (e.g., LUN-0 332-0). Each of Planes 334-0 to 334-5 can include a codeword that span two adjacent planes, as illustrated in FIGS. 3-1 and 3-2 (e.g., CW-3, 338-3), where a first portion 344-1 of CW-3 338-3 can be written to a first plane (e.g., any one of plane 334-0 through 334-4 in LUN-0 332-0 and plane 334-0 through 334-3 in LUN 332-1) and a second portion 344-2 of CW-3 338-3 can be written to a second plane directly adjacent to the first plane. Spanning a codeword across more than one plane of memory can allow for flexibility in terms of code rate for fixed page size and enable more error correction coding (ECC) parity being used for stronger protection. The approach of the present disclosure stores fewer CWs in a multi-plane page, e.g., 4X−1 CWs instead of 4X where X is the number of planes. This may result in leaving a portion of a page of memory unprogrammed because that portion was insufficiently large to store another whole codeword.

In addition to physically writing the codewords (e.g., 338-0 to 338-3) to each plane of the multiple planes (e.g., 334-0 through 334-5) of the LUN-0 332-0 and LUN-1 332-1, the codeword parity management unit 313 also indexes each codeword (e.g., 338-0 to 338-3) as a virtual codeword 346 (e.g., 346-0 to 346-4) in each of a virtual plane 348 (e.g., 348-0 through 348-4). As discussed herein, the virtual codewords 346 of the virtual plane 348 provides an index (or address) to each of the codewords 338 in the multiple planes 334, where such an indexing scheme allows for the codewords 338 to be RAIN XOR-ed and to generate and indexes RAIN parity codewords 350 (350-0 through 354-4), as discussed more herein.

For the various embodiments, the codeword parity management unit 313 provides a one-to-one indexing of the plurality of codewords 338 (e.g., 338-0 to 338-3) in the multiple planes 334 (e.g., 334-0 through 334-5) of LUN-0 332-0 and LUN-1 332-1 to the virtual codewords 346 (346-0 through 346-4) for the virtual planes 348 (348-0 through 348-4). So, each codeword 338 (e.g., 338-0 to 338-3) in the multiple planes 334 has two different indices (or pointers), where the first is to each of the codewords 338 (e.g., 338-0 to 338-3) in the "physical" plane 334 (e.g., 334-0 through 334-5) and the second is each of the virtual codeword 346 (e.g., virtual codewords 346-0 through 346-4) in the virtual plane 348 (e.g., 348-0 through 348-4).

In addition, each of the virtual planes 348 is at least one codeword wider than the width of the physical plane 334. In other words, each of the virtual plane 348 includes a number of the virtual codeword indices that is greater than the plurality of codewords 338 in the plane 334 of the memory cells. As discussed herein, this configuration helps to provide sufficient separation between the codewords 338 such that recovery from a plane failure becomes possible. For example, for the various embodiments the codeword parity management unit 313 in writing the plurality of codewords to the plurality of memory blocks of the memory device can write "M" codewords 338 in each block (e.g., blocks 236-1 to 236-R illustrated in FIG. 2, herein) of the plurality of memory blocks of the memory device 330, wherein a first portion 344-1 of at least one of the M codewords 338 (e.g., CW-3, 338-3) is written in a first block of the plurality of memory blocks and a second portion 344-2 of the at least one of the M codewords 338 (e.g., CW-3, 338-3) is written in a second block of the plurality of memory blocks. The physical codeword index is given an indicator value of 0 to M. With respect to the virtual codewords 346, assigning the virtual codeword index to each of the plurality of codewords 338 then includes assigning the virtual codeword index of M+1 virtual codewords in each virtual block of the plurality of virtual blocks of the memory device. The virtual codeword index will have an indicator value of 0 to M+1 and, as discussed herein, each of the M+1 virtual codewords is completely contained within a virtual block of the plurality of virtual blocks. For the various embodiments, M is a positive non-zero integer having a value of 2 to 20. An example where M is 4 is provided in FIGS. 3-1 and 3-2.

As noted above, the virtual codewords 346 of the virtual plane 348 provides an index (or address) to each of the codewords 338 in the multiple planes 334, where such an indexing scheme accomplished by the codeword parity management unit 313 allows for the codewords 338 to be RAIN XOR and to generate and indexes RAIN parity codewords 350 (350-0 through 354-4). The codeword parity management unit 313 accomplishes this by accumulating an XOR operation for each of the plurality of codewords having the virtual codeword index with the indicator value of N and then generating a RAIN parity codeword for each of the accumulated XOR operation of the plurality of codewords having the virtual codeword index with the indicator value of N, where N is a positive non-zero integer having a value of 0 to M+1. The codeword parity management unit 313 writes the plurality of codewords and the RAIN parity codeword for each of the accumulated XOR operation of the plurality of codewords having the virtual codeword index with the indicator value of N to a RAIN stripe, where the RAIN parity codeword is concatenated after the Mth codeword to maintain a numeric order of the virtual codeword index. The amount of overhead in performing RAIN operation with the virtual codeword index is defined as $(M+1)/(N\times(M\times-1))$ which, when M=4, becomes $5/(N\times(4x-1))$, where x is the number of blocks and N is the number of die.

So, for the example seen in FIGS. 3-1 and 3-2, the codeword parity management unit 313 XORs each codewords 338 with the index of the same virtual codeword 346 to generate the RAIN parity codewords 350 with the same virtual codeword 346 index. In other words, all virtual codewords (e.g., 346-0) for the same virtual codeword index (e.g., codeword 338-0) are XOR-ed together to generate a RAIN parity codeword for the same virtual codeword index (e.g., RCW-0, 350-0). In the same way, all virtual codewords 346 for the entire group of the same codeword 338 user are XOR-ed together to generate a RAIN parity codeword 350. So, all CW-V1 (346-1) in FIGS. 3-1 and 3-2 are XOR-ed together to generate RAIN parity codeword 350-1; all CW-V2 (346-2) in FIGS. 3-1 and 3-2 are XOR-ed together to generate RAIN parity codeword 350-2; all CW-V3 (346-3) in FIGS. 3-1 and 3-2 are XOR-ed together to generate RAIN parity codeword 350-3; and all CW-V4 (346-4) in FIGS. 3-1 and 3-2 are XOR-ed together to generate RAIN parity codeword 350-4. As illustrated in FIGS. 3-1 and 3-2, the RAIN parity codewords 350 are indexed in virtual planes after the last user CWs in the last plane and last die, as shown in FIGS. 3-1 and 3-2.

RAIN is only one example of an implementation of virtual codewords according to the present disclosure. In general, RAIN is an umbrella term for data storage schemes that divide and/or replicate (e.g., mirror) data among multiple memory devices, for instance. The multiple memory devices in a RAIN array may appear to a user and the operating system of a computer as a single memory device (e.g., disk). RAIN can include striping (e.g., splitting) data so that different portions of the data are stored on different memory devices (e.g., the memory devices 130 and/or 140). The portions of the more than one device that store the split data are collectively referred to as a stripe. As is understood, RAIN can also include mirroring, which can include storing duplicate copies of data on more than one device. As an example of the former, write data can be striped across N−1 of N memory devices, where error data can be stored in an Nth memory device. Error data (e.g., parity data) can be determined by the codeword parity management unit 313 and written to the Nth memory device. The codeword parity management unit 313 can employ a flexible stripe length (e.g., to account for bad blocks).

Figures 1, 4:
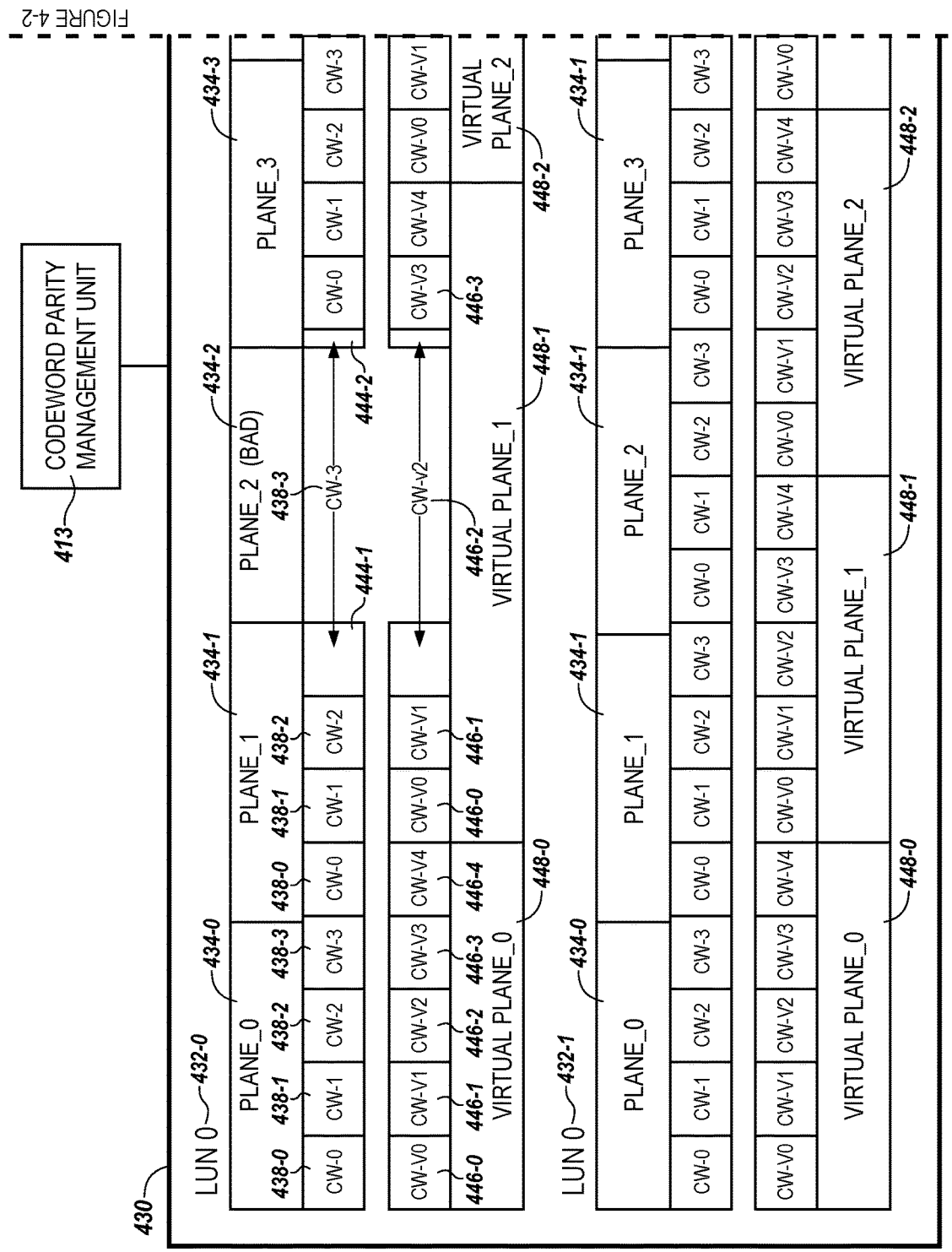
Figures 2, 4:
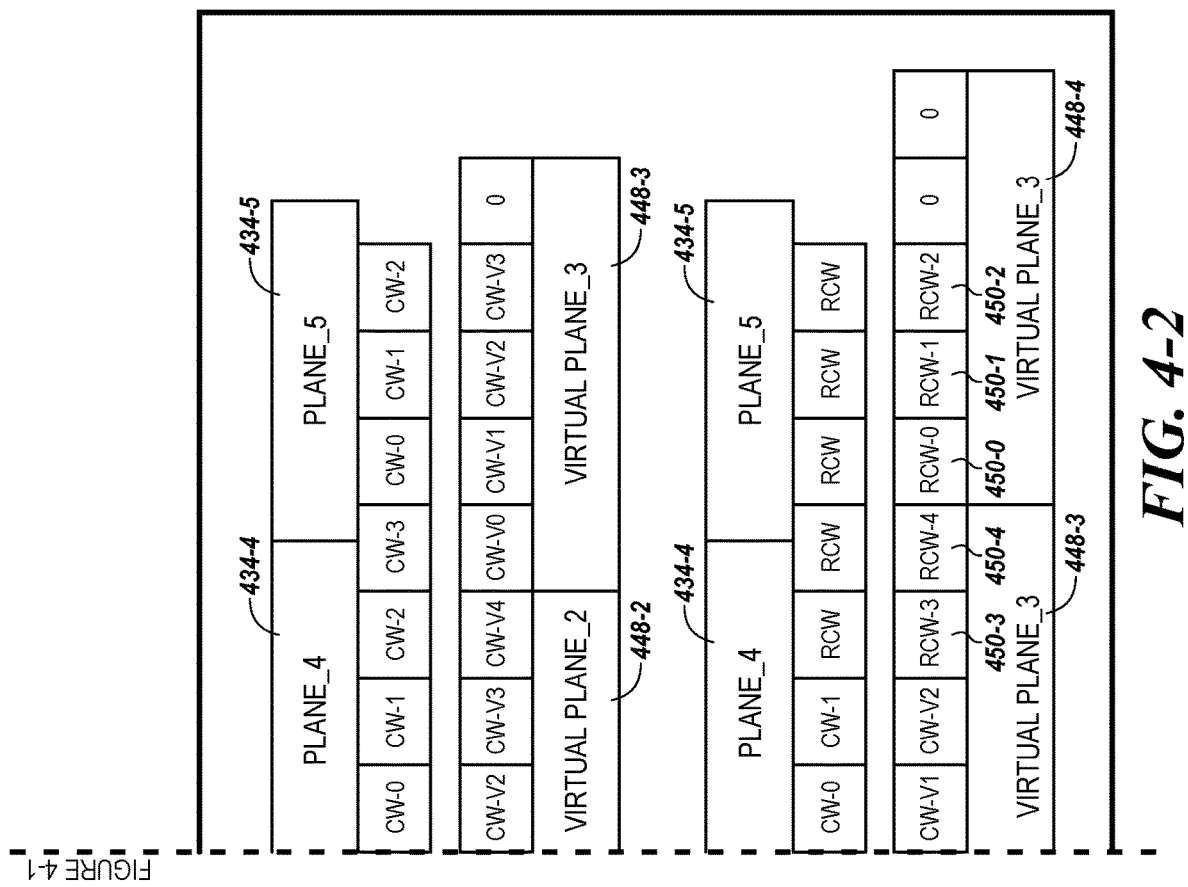

FIGS. 4-1 and 4-2 illustrates an example memory device 430 and codeword parity management unit 413 in accordance with the example memory device 330 and codeword parity management unit 313 in accordance with FIGS. 3-1 and 3-2. Unlike FIGS. 3-1 and 3-2, however, the example memory device 430 seen in FIGS. 4-1 and 4-2 includes a Plane (e.g., Plane-2 434-2) that has been identified as a bad plane of memory by, for example, the codeword parity management unit 413 in conjunction with the block table 116 as a result of failing a test of planes in the number of memory devices (e.g., the memory devices 130 and/or 140). As illustrated in FIGS. 4-1 and 4-2, when a plane failure occurs in a situation where a codeword spans across more than one plane of memory (e.g., a first portion 444-1 of a codeword 438-3 (CW-3) is written to the first plane 434-1 in LUN-0 432-0 and a second portion 444-2 of the codeword 338-3 is written to the second plane 434-2 in LUN-0 432-0) not only have the three codewords (e.g., CW-0 438-0, CW-1 438-1 and CW-2 438-2) completely within the bad plane of memory (e.g., Plane-2, 434-2) been corrupted, but also the portions of codewords (e.g., 444-1 and 444-2) stored in the adjacent planes (e.g., Plane-1 434-1 and Plane-3 434-3) that were storing the portions of the codeword spanning across the adjacent planes (e.g., CW-3 438-3) are corrupted. As a result, corruption of one plane (e.g., Plane 2 434-2) can result in a problem for the two adjacent planes that were storing a portion of the codeword spanning across the adjacent planes (e.g., CW-3 438-3).

For example, as shown in FIGS. 4-1 and 4-2, Plane-2 434-2 is or has become corrupted. In some embodiments, the determination that Plane-2 434-2 is or has become corrupted can be made during manufacture and/or during runtime of a memory device such as the memory devices 130, 140 illustrated in FIG. 1, herein. In a non-limiting example in which it is determined that Plane-2 434-2 has become corrupted during runtime, the data (e.g., the codewords) that become corrupted and therefore lost can be recovered as described above. In addition to, or in the alternative, data (e.g., the codewords) written to the rest of (or at least a portion of) the stripe (e.g., of all the blocks or a portion of the blocks in the LUN-0 432-0) can be written to a different location (e.g., to a different LUN, such as the LUN-1 332-1 illustrated in FIGS. 3-1 and 3-2, herein).

In this example, once the data has been written to a different LUN, data can be written to (or rewritten to) the uncorrupted planes (e.g., Plane-0 434-0, Plane-1 434-1, Plane-3 434-3, Plane-4 434-4, and/or Plane-5 434-5). Once the data has been written (or rewritten) to the uncorrupted planes of the LUN-0 432-0, the codewords can be indexed again with respect to the virtual planes 448-0, 448-1, 448-2, and/or 448-3, as described above.

According to the present disclosure, upon identifying a bad plane of memory the codeword parity management unit 413 can read a two or more virtual planes of memory (e.g., virtual plane-1 442-2 and virtual plane-2 442-3) through the proper indexing as a single virtual plane (e.g., virtual plane-1 442-2) to allow for the RAIN parity and RAIN recovery. For the various embodiments, an error in a plane of the multiple planes provided herein can be identified with a redundant array of independent NAND (RAIN) component. When an error is identified in a plane any physical codeword that is affected, including those that partially reside on the failed plane, are recovered by performing an exclusive or (XOR) operation as part of a RAIN operation using the virtual codewords. For example, physical codewords affected can be recovered by performing the XOR operation as part of the RAIN operation using the virtual codeword index assigned to the plurality of codewords in blocks adjacent to the block with the error. In an additional embodiment, physical codewords affected can be recovered by performing the XOR operation as part of the RAIN operation using each codeword having a same physical codeword index to generate parity information corresponding to each codeword having the same physical codeword index. So, the RAIN operation can be accomplished by decoding the other codewords in the stripe not affected by the plane failure. Then each virtual plane codeword index 446 for each codeword 438 affected by the plane failure is retrieved by the codeword parity management unit 413, where the codeword parity management unit 413 performs an XOR operation on all decoded codewords in other virtual planes 446 with the same virtual codeword index to recover the corrupted codewords. As discussed above, because of the M+1 separation of the virtual codewords 446 in the virtual planes 448 from the codewords 438 in the planes 434 the failure of a single plane 434 will not affect more than one codeword 438 with the same virtual plane codeword index. The result is that the codewords for the bad plane will always be recoverable.

FIG. 5 is a flow diagram corresponding to a method 552 for parity protection in non-volatile memory in accordance with some embodiments of the present disclosure. The method 552 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 552 is performed by the codeword parity management unit 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 554, a plurality of codewords are written to a plurality of memory blocks of a memory device where, as discussed herein, the codeword parity management unit 113 assigns each of the plurality of codewords a physical codeword index corresponding to a respective memory block in which each codeword is written (as described in connection with FIGS. 3-1 and 3-2). At operation 556, a virtual codeword index is assigned to each of the plurality of codewords to provide a plurality of virtual codeword indices, where assigning the virtual codeword index to each of the plurality of codewords is based, at least in part, on a location in a virtual block among a plurality of virtual blocks of memory cells corresponding to the physical codeword index of each codeword among the plurality of codewords. As described above, a further operation to perform a data recovery operation can be performed by, for example, a processing device, such as the codeword parity management unit 113 illustrated in FIG. 1, herein. In some embodiments, the data recovery operation can be performed in response to a determination that a failure involving host data written to the memory device has occurred.

Figure 6:
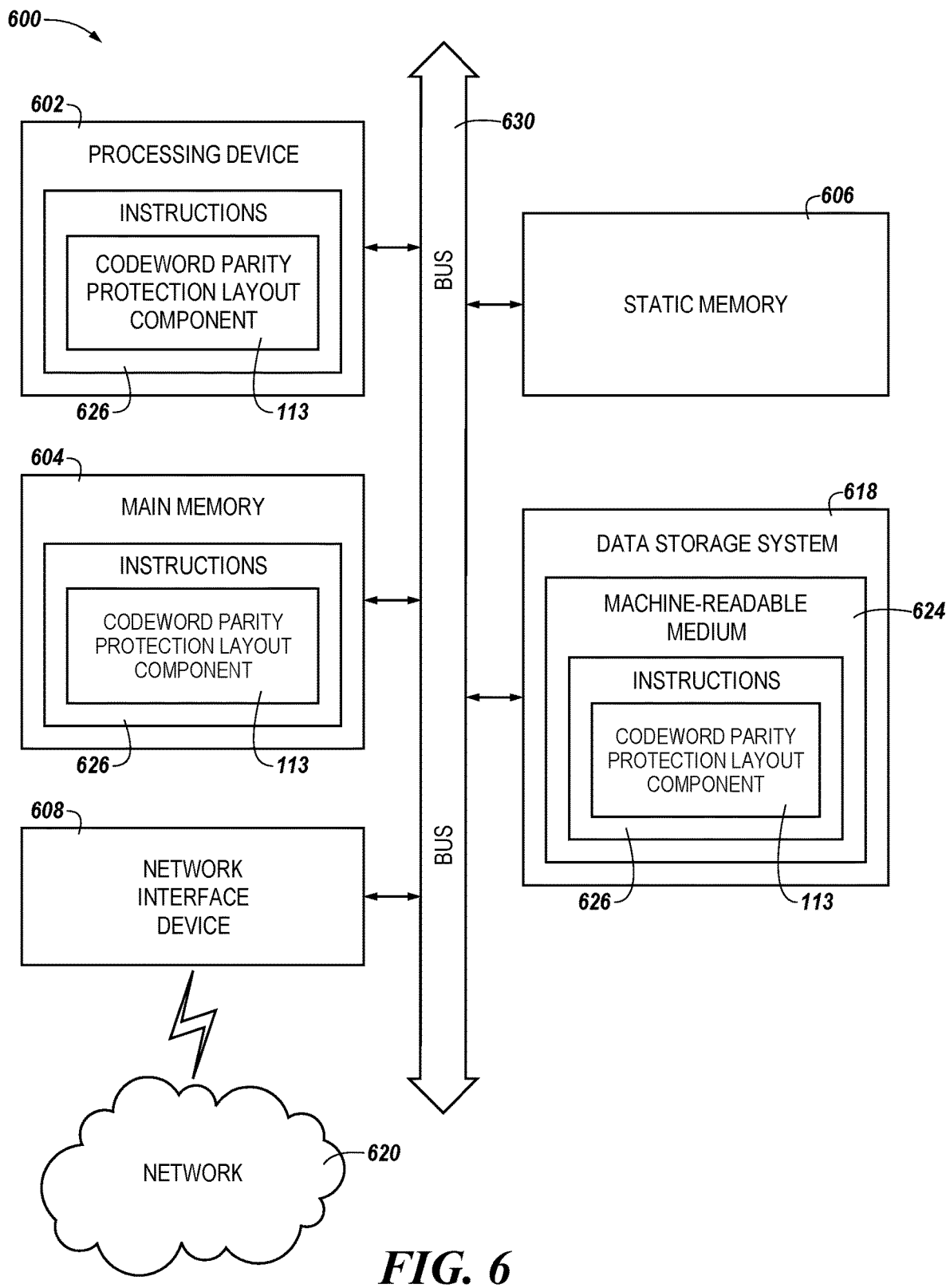
FIG. 6 is a block diagram of an example computer system in which embodiments of the present disclosure can operate.

FIG. 6 is a block diagram of an example computer system 600 in which embodiments of the present disclosure can operate. For example, FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the codeword parity management unit 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a codeword parity management unit (e.g., the codeword parity management unit 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
    writing a plurality of codewords to a plurality of memory blocks of a memory device, wherein each of the plurality of codewords has a physical codeword index corresponding to a respective memory block in which each codeword is written;
    assigning a virtual codeword index to each of the plurality of codewords to provide a plurality of virtual codeword indices, wherein assigning the virtual codeword index to each of the plurality of codewords is based, at least in part, on a location in a virtual block among a plurality of virtual blocks of memory cells corresponding to the physical codeword index of each codeword among the plurality of codewords; and
    performing an exclusive-or (XOR) operation using each codeword having a same physical codeword index to generate parity information corresponding to each codeword having the same physical codeword index.

2. The method of claim 1, wherein:
    the plurality of memory blocks comprise a plane of memory cells, wherein the plurality of codewords are not fully contained within the plane of memory cells,
    the plurality of virtual blocks comprise a virtual plane of memory cells, wherein the plurality of virtual codeword indices are fully contained within the virtual plane of memory cells, and
    the virtual plane includes a number of the virtual codeword indices that are greater than the plurality of codewords in the plane of memory cells.

3. The method of claim 1, wherein writing the plurality of codewords to the plurality of memory blocks of the memory device includes:
    writing M codewords in each block of the plurality of memory blocks of the memory device, wherein a first portion of at least one of the M codewords is written in a first block of the plurality of memory blocks and a second portion of the at least one of the M codewords is written in a second block of the plurality of memory blocks and wherein the physical codeword index has an indicator value of 0 to M−1; and
    wherein assigning the virtual codeword index to each of the plurality of codewords includes:
    assigning the virtual codeword index of M+1 virtual codewords in each virtual block of the plurality of virtual blocks of the memory device, wherein the virtual codeword index has an indicator value of 0 to M and each of the M+1 virtual codewords is completely contained within a virtual block of the plurality of virtual blocks, wherein M is a positive non-zero integer having a value of 2 to 20.

4. The method of claim 3, including:
accumulating an XOR operation for each of the plurality of codewords having a virtual codeword index given by N; and
generating a RAIN parity codeword for each of the accumulated XOR operation involving the plurality of codewords having the virtual codeword index given by N, wherein N is a positive non-zero integer having a value of 0 to M.

5. The method of claim 4, including writing the plurality of codewords and the RAIN parity codeword for each of the accumulated XOR operation involving the plurality of codewords having the virtual codeword index given by N to a RAIN stripe, wherein the RAIN parity codewords are concatenated on a user codeword to maintain a numeric order of the virtual codeword index in each virtual plane of memory cells.

6. The method of claim 5, wherein an amount of overhead in performing RAIN operation with the virtual codeword index is defined as $(M+1)/(N \times (M \times -1))$, where x is the number of blocks and N is the number of die.

7. The method of claim 4, including:
identifying an error in a block of the plurality of memory blocks with a redundant array of independent NAND (RAIN) component; and
performing an exclusive or (XOR) operation in a RAIN operation using the virtual codeword index assigned to the plurality of codewords in blocks adjacent to the block with the error.

8. An apparatus, comprising:
a codeword parity management unit configured to:
write a plurality of codewords to a plurality of memory blocks of a memory device,
wherein each of the plurality of codewords has a physical codeword index corresponding to a respective memory block in which each codeword is written; and
assign a virtual codeword index to each of the plurality of codewords to provide a plurality of virtual codeword indices, wherein assigning the virtual codeword index to each of the plurality of codewords is based, at least in part, on a location in a virtual block among a plurality of virtual blocks of memory cells corresponding to the physical codeword index of each codeword among the plurality of codewords; and
in writing the plurality of codewords to the plurality of memory blocks of the memory device, the codeword parity management unit:
writes M codewords in each block of the plurality of memory blocks of the memory device, wherein a first portion of at least one of the M codewords is written in a first block of the plurality of memory blocks and a second portion of the at least one of the M codewords is written in a second block of the plurality of memory blocks and wherein the physical codeword index has an indicator value of 0 to M−1; and
in assigning the virtual codeword index to each of the plurality of codewords:
assigns the virtual codeword index of M+1 virtual codewords in each virtual block of the plurality of virtual blocks of the memory device, wherein the virtual codeword index has an indicator value of 0 to M and each of the M+1 virtual codewords is completely contained within a virtual block of the plurality of virtual blocks, wherein M is a positive non-zero integer having a value of 2 to 20.

9. The apparatus of claim 8, wherein the plurality of memory blocks comprise a plane of memory cells and the plurality of virtual blocks comprise a virtual plane of memory cells, and wherein the codeword parity management unit writes:
the plurality of codewords within the plane of memory cells where the plurality of codewords are not fully within the plane of memory cells; and
the plurality of virtual codeword indices fully within a virtual plane of memory cells, wherein the virtual plane includes a number of the virtual codeword indices that are greater than the plurality of codewords in the plane of memory cells.

10. The apparatus of claim 8, wherein the codeword parity management unit:
accumulates an XOR operation involving each of the plurality of codewords having a virtual codeword index given by N; and
generates a RAIN parity codeword for each of the accumulated XOR operation involving the plurality of codewords having the virtual codeword index given by N, wherein N is a positive non-zero integer having a value of 0 to M.

11. The apparatus of claim 10, wherein the codeword parity management unit writes the plurality of codewords and the RAIN parity codeword for each of the accumulated XOR operations of the plurality of codewords having the virtual codeword index given by N to a RAIN stripe, wherein the RAIN parity codewords are concatenated on a user codeword to maintain a numeric order of the virtual codeword index in each virtual plane of memory cells.

12. The apparatus of claim 8, wherein the codeword parity management unit:
identifies an error in a block of the plurality of memory blocks with a redundant array of independent NAND (RAIN) component; and
performs an exclusive or (XOR) operation in a RAIN operation using the virtual codeword index assigned to the plurality of codewords in blocks adjacent to the block with the error.

13. A system, comprising:
a memory device having a plurality of memory blocks that comprise a plane of memory cells and a plurality of virtual blocks of that comprise a virtual plane of memory cells; and
a processing device coupled to the plurality of memory blocks, the processing device to perform operations comprising:
writing a plurality of codewords to the plurality of memory blocks of the memory device, wherein each of the plurality of codewords has a physical codeword index corresponding to a respective memory block in which each codeword is written by writing M codewords in each block of the plurality of memory blocks of the memory device, wherein:
a first portion of at least one of the M codewords is written in a first block of the plurality of memory blocks and a second portion of the at least one of the M codewords is written in a second block of the plurality of memory blocks and
the physical codeword index has an indicator value of 0 to M−1;

assigning a virtual codeword index to each of the plurality of codewords to provide a plurality of virtual codeword indices, wherein assigning the virtual codeword index to each of the plurality of codewords is based, at least in part, on a location in a virtual block among the plurality of virtual blocks of memory cells corresponding to the physical codeword index of each codeword among the plurality of codewords and assigning the virtual codeword index of M+1 virtual codewords in each virtual block of the plurality of virtual blocks of the memory device, wherein the virtual codeword index has an indicator value of 0 to M and each of the M+1 virtual codewords is completely contained within a virtual block of the plurality of virtual blocks, when M is a positive non-zero integer having a value of 2 to 20.

14. The system of claim 13, wherein the processing device is to perform operations to write the plurality of codewords within the plane of memory cells where the plurality of codewords are not fully within the plane of memory cells and to write the plurality of virtual codeword indices fully within a virtual plane of memory cells, wherein the virtual plane includes a number of the virtual codeword indices that are greater than the plurality of codewords in the plane of memory cells.

15. The system of claim 13, wherein the processing device is to perform operations to accumulate an exclusive or (XOR) operation for each of the plurality of codewords having the virtual codeword index given by N and to generate a RAIN parity codeword for each of the accumulated XOR operation of the plurality of codewords having the virtual codeword index given by N, wherein N is a positive non-zero integer having a value of 0 to M.

16. The system of claim 15, wherein the processing device is to perform operations to write the plurality of codewords and the RAIN parity codeword for each of the accumulated XOR operations of the plurality of codewords having the virtual codeword index given by N to a RAIN stripe, wherein the RAIN parity codewords are concatenated on a user codeword to maintain a numeric order of the virtual codeword index in each virtual plane of memory cells.

17. The system of claim 13, wherein the processing device is to identify an error in a block of the plurality of memory blocks with a redundant array of independent NAND (RAIN) component; and performs an exclusive or (XOR) operation in a RAIN operation using the virtual codeword index assigned to the plurality of codewords in blocks adjacent to the block with the error.

* * * * *